United States Patent [19]

Barczys

[11] Patent Number: 4,725,794
[45] Date of Patent: Feb. 16, 1988

[54] RECEIVER MULTICOUPLER USING NO-LOSS SIGNAL SPLITTER

[76] Inventor: Daniel A. Barczys, 32 Hess Pl., Lancaster, N.Y. 14086

[21] Appl. No.: 65,664

[22] Filed: Jun. 24, 1987

Related U.S. Application Data

[63] Continuation of Ser. No. 749,320, Jun. 27, 1985, abandoned.

[51] Int. Cl.[4] .............................................. H03H 11/36
[52] U.S. Cl. ...................................... 333/100; 333/128; 333/124
[58] Field of Search ............... 333/100, 124, 128, 136; 330/53, 148, 286, 295; 455/6, 132

[56] References Cited

U.S. PATENT DOCUMENTS

| | | | |
|---|---|---|---|
| 1,857,359 | 5/1932 | Cohen | 455/6 |
| 2,611,895 | 9/1952 | Lacey | 455/6 |
| 3,187,259 | 6/1965 | Scandurra et al. | 455/6 |
| 3,419,813 | 12/1968 | Kamnitsis | 330/295 |
| 3,477,032 | 11/1969 | Bailey et al. | 330/295 |

Primary Examiner—Paul Gensler
Attorney, Agent, or Firm—Christel, Bean & Linihan

[57] ABSTRACT

A receiver multicoupler having multiple, isolated outputs generated from a single input comprising a no loss signal splitting network connected to the input having insignificant power absorption and being in the form of parallel tuned circuits providing multiple voltage outputs from a single input and a plurality of very high input resistance voltage amplifiers, each of the amplifiers having an input connected to the signal splitting network, and each of the amplifiers acting as an impedance transformation device and supplying isolation.

11 Claims, 7 Drawing Figures

RECEIVER MULTICOUPLER USING NO-LOSS SIGNAL SPLITTER

This application is a continuation of application Ser. No. 749,320, filed June 27, 1985 now abandoned.

BACKGROUND OF THE INVENTION

This invention relates to the art of radio receiver multicouplers, and more particularly to a new and improved multicoupler having multiple, isolated outputs from a single input which is practical for very short wavelength operation in the microwave region and all lower frequencies.

Receiver multicouplers are radio communications products which produce a number of output ports from a single input and which have isolation of some degree between output ports. These multicouplers may be: passive, having power loss through a power divider; active, having an amplifier preceding the lossy power divider to produce positive overall gain; or completely electronic, having amplifiers which provide the distribution and isolation function. Each method has certain disadvantages. The all-electronic systems exemplified by U.S. Pat. Nos. 3,710,360, 3,392,335 become less useful at frequencies above 50 MHz. The power divider system, whether passive or active, is in universal use at present above 30 Mhz. Power divider output levels are always attenuated in proportion to the number of ports. To overcome this attenuation which reduces the following receiver's sensitivity, an amplifier usually precedes the divider. Power divider systems have large losses for large number of outputs, requiring larger amplifier gains, and are bulky and not easily field expandable. Use of power dividers in very weak signal environments is tolerated because of the special requirements imposed by the standard use of low impedance cable for interconnection at radio frequencies. This impedance is under 100 ohms, generally 50 ohms.

Previous attempts to modify this power divider method have used various means to distribute the signal other than by a power divider. In these alternate methods, the input amplifier is still used but the power divider is replaced by amplifier circuits or transformers to produce some degree of isolation between output ports. Isolation between output ports is required to keep ports independent of each other. The principle common to all of these alternate methods is that an amplifier matches the input impedance and it or another amplifier acts as a buffer or impedance changer, in addition to providing gain. All distribution is performed in the output stage of this amplifier where there is no concern of effects on the input. At higher frequencies, the problem of space asserts itself. The problem of equal distribution to separated ports, physically distant from each other by inches from a single point in the output of an amplifier, is difficult when these distances are a large fraction of the signal wavelength. These methods therefore work well at low frequencies but are not practical above 50 MHz.

It would, therefore, be highly desirable to provide a receiver multicoupler which operates in a different manner, is simpler, provides greater isolation and is practical at high radio frequencies.

SUMMARY OF THE INVENTION

It is, therefore, a primary object of this invention to provide a new and improved receiver multicoupler.

It is a further object of this invention to provide such a multicoupler which is relatively simple, provides greater isolation and is practical at frequencies into the microwave region.

It is a more particular object of this invention to provide such a multicoupler which eliminates signal power consumption and input resistance effects, compensates for amplifier input reactance effects, and provides physically separated yet identical signal locations at very short wavelengths.

The present invention provides a receiver multicoupler having multiple, isolated outputs generated in a characteristic manner from a single input, yet which is practical for very short wavelength operation and all other lower frequencies. The multicoupler of the present invention comprises a passive voltage-distribution system having no insertion loss, followed by a voltage amplifier at each output point acting as an impedance buffer and supplying isolation and, if desired, gain. While feasible at any frequency, this voltage distribution and amplifying method is most suited to applications using low impedance coaxial cables for interconnections. The term loss-less or no-loss signal splitting can be applied to the distribution network of the present invention because the power absorbed by the input circuits is insignificant. Its effect is to decrease the circuit Q slightly and this effect will most likely need to be further increased with a shunting resistance to produce wide-band operation. The signal splitting system of the present invention comprises parallel tuned circuits which provide multiple voltage outputs from a single, normally 50 ohm, coaxial cable. These tuned circuits, broadbanded if necessary by a shunt resistance, enable a low impedance input signal to be properly terminated yet to produce multiple, similar signals at widely separated locations. Voltage amplifiers at all outputs points on this network are necessary to produce the proper buffering of those voltage points from the low impedance output coaxial terminals, along with isolation and gain.

The foregoing and additional advantages and characterizing features of the present invention will become clearly apparent upon a reading of the ensuing detailed description together with the included drawing wherein:

DETAILED DESCRIPTION OF THE ILLUSTRATED EMBODIMENTS

A receiver multicoupler is a device which produces multiple duplicate outputs from one input, and has circuitry which causes attenuation (isolation) to exist between output ports. One major use is to supply many radio receivers from one wide bandwidth antenna. Power dividers are in general use for this purpose above approximately 50 MHz while electronic circuitry may be used at lower frequencies. Whether a passive power divider or active electronic distribution circuitry is employed, one aspect of their operation is identical: one or more amplifying stages precede the distribution network to overcome signal losses incurred in the duplicating process.

To understand why power divider usage is universally accepted though its loss characteristic is undesirable, one must understand the influence of low impedance coaxial cable upon RF equipment design. For practical reasons, coaxial cables are made to have low impedance characteristics, generally 50 ohms. Because the concept of matched impedances is always observed, input and output terminations of all RF equipment are caused to be the same value as the coaxial cable. Remembering that a signal value at a particular impedance value is equivalent to stating a power value, a power loss through an N-port power divider could be disregarded if the output impedance value was increased to the same extent that the output power was decreased, as seen by the relationship: voltage=$\sqrt{\text{power} \times \text{impedance}}$. It is the voltage which is important because all linear low level RF amplifiers are voltage amplifiers. However, this method is impractical. A fixed impedance level for separate components of radio frequency equipment is mandatory because of coaxial cable usage and its standardized impedance value.

A linear amplifier located on a transmission line may have any input resistance as long as the impedance requirements of the signal source are met. That is, any number of high input resistance amplifiers may be placed in parallel with a 50 ohm, properly terminated coaxial line with no adverse effect on the signal present on the line, except at those higher frequencies where the input reactance is approaching the cable impedance. Though not absorbing power, the low reactance value disturbs the operation of the transmission system unless compensated for. In distributed amplifier design, a series connection of transistor inputs is used which incorporates the transistor input capacitance with a series inductor to simulate a coaxial cable. In this fashion, a multiple transistor arrangement is produced. The input is always untuned and series, not parallel, connection is used.

The method of the present invention uses the high input resistance concept to eliminate signal power consumption and incorporates the input reactance into parallel tuned circuits, thereby eliminating all input resistance effects and compensating for the input reactance effects. The resulting distribution system is therefore a no-loss signal splitter system. Incidental to this method, yet of great importance, is the ability to easily provide physically separated yet identical signal locations at very short wavelengths. A properly chosen amplifier device at these signal locations will buffer these voltage points from loading, supply any needed gain and produce acceptable (20 dB) reverse isolation.

The no-loss passive signal distribution network of the present invention can be placed at the input because no change in signal/noise ratios occurs, with transistor circuits added mainly for impedance buffering and isolation purposes. This distribution network is more properly called a signal splitter network because it splits one source into multiple identical signal voltages at separated locations. One 50 ohm resistor termination is provided for proper matching to the input cable. At each point of equivalent voltage, a high resistance transistor circuit is used as a voltage treatment circuit (buffer amplifier) to the output which is caused to be 50 ohms. Normal transistor operational limits are not affected by this network and, with modern printed circuit techniques, operation into the Microwave region (GHz) is easily accomplished.

The voltage distribution system of the present invention has no signal loss so that no make-up gain is required to precede it; provides separated multiple ports where transistor circuits may be located; compensates for the input reactance of those transistor circuits; is practical at all frequencies where transistors are operational; uses minimum gain amplifiers which minimize the effects of interference; has individual channel transistors rather than one common transistor for protection against total, catastrophic failure; and has better port expansion characteristics as only simple cascading is required.

In its simplest form, paralleling of high resistance circuits at a point with one 50 ohm load resistor is not practical. While no power is dissipated in the high resistance amplifier input circuits, the capacitance of each device is not treated. Because capacitive reactance varies inversely with frequency, an upper frequency of operation will always be reached where the load resistor is shunted excessively and the 50 ohm match no longer exists. Also, the limited number of circuits possible of connection and operation at a single point requires that a different method be found.

A parallel LC circuit has a high impedance at the LC junction in the vicinity of resonance. If other similar LC circuits are connected in parallel at their common LC junctions, little if any degradation occurs to each circuit. A shunt resistor may even be needed to properly degrade the responses for the desired bandwidth. All parallel sections will respond identically to a stimulus in any one section. If a signal was coupled into one of these resonant sections, all of the other sections would be supplied this same signal via the common point. There would be points along these inductors where the signal amplitudes would be equal to the input signal, if the required high resistance probe was used.

The voltage distribution network of the present invention has two important characteristics: it is resonant to allow for compensation of attached transistors; it is a duplication method which develops separated points of equal voltage. These voltages are at or near the input impedance level, but this information is not important as matching of impedances at these voltage points is not attempted. The transistor being voltage sensitive, its output responds to the input voltage, with complete freedom as to the amount of gain desired, if any. Because it acts as a buffering device, the transistor isolates the distribution network from loading by the succeeding circuits. Reverse signal transmission is sufficiently low through certain transistor types to allow proper isolation to exist between outputs, which are designed to have the normal 50 ohms output impedance. Therefore, the two necessary features of a power divider are duplicated in this loss-less device: multiple outputs from a single source and isolation between outputs. Except for the gain/loss feature, the passive power divider and the active signal splitter operate identically at their operating frequencies. A minor advantage of the signal splitter circuit occurs at out-of-band operation where the output isolation increases, while the power divider isolation will decrease.

Whereas in normal RF practice a transistor is matched to the input circuit, the distribution network of the present invention requires a high degree of mismatch since no power transfer is desired.

Figure 1:
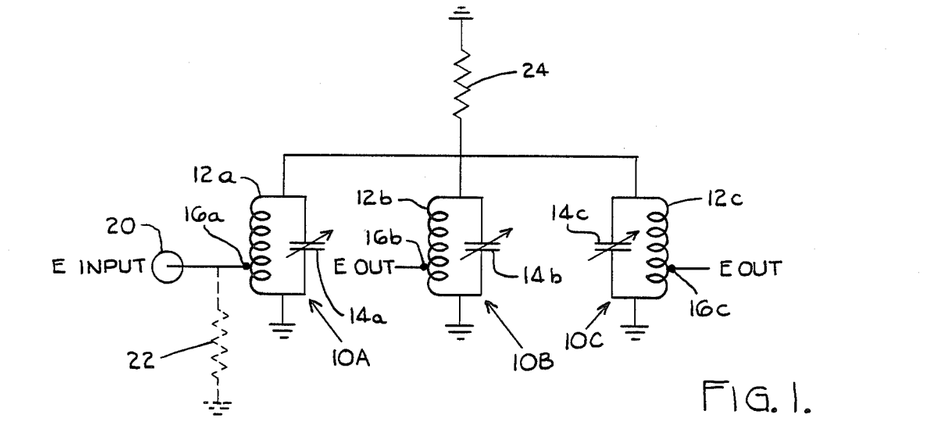
FIG. 1 is a schematic diagram of parallel resonant circuits illustrating principles of a no-loss signal splitting network utilized in the receiver multicoupler of the present invention.

Referring now to FIG. 1, there are shown groups of parallel resonant circuits tuned to the same frequency and illustrating principles of the signal splitting network utilized in the receiver multicoupler of the present invention. There are three separate, parallel resonant circuits 10a, 10b, 10c each comprising the parallel combination of an inductor 12a, 12b, 12c and variable capacitor 14a, 14b, 14c. The resonant circuits 10a, 10b, 10c are coupled at the high impedance LC junctions thereof and each resonant circuit 10a, 10b, 10c is referenced at the opposite end to ground. Identical tap points 16a, 16b and 16c are selected at each inductor 12a, 12b, 12c, respectively. In particular point 16a is an input tap connected to a 50 ohm coaxial cable 20. Points 16b and 16c are output voltage taps. A signal voltage at one point will be reproduced identically at all other tap points. The selectivity (Q factor) of the combination can be represented by an inherent shunt resistance or by an optional, added resistance, so by transformer action, a 50 ohm resistance point can be found at some point on the inductor for input matching purposes. The 50 ohm effective resistance for matching to cable 20 is represented by resistor 22 connected between cable 20 and ground. This matching of the input cable 20 to the transformed shunt resistance may, if desired, be accomplished in the capacitance leg by a ratio of capacitances. A shunt resistor 24 between the high impedance LC junction and ground can be provided for the purpose of increasing bandwidth. A virtual connection exists between equal level tap points, making isolation between tap points non-existent.

Figure 2:
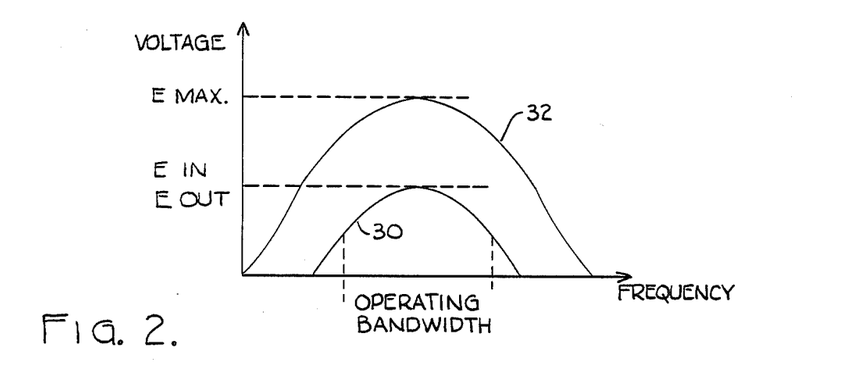
FIG. 2 is a graph illustrating operation of the network of FIG. 1.

FIG. 2 is a plot of voltage as a function of operating frequency illustrating the operation of the circuit of FIG. 1. In particular, curve 30 shows the tap point operation where E is reproduced identically as E out at all other tap points at the resonant frequency, the operating bandwidth being designated in broken lines. Curve 32 shows the LC junction signal as a function of frequency and having a maximum voltage level Emax.

Figure 3:
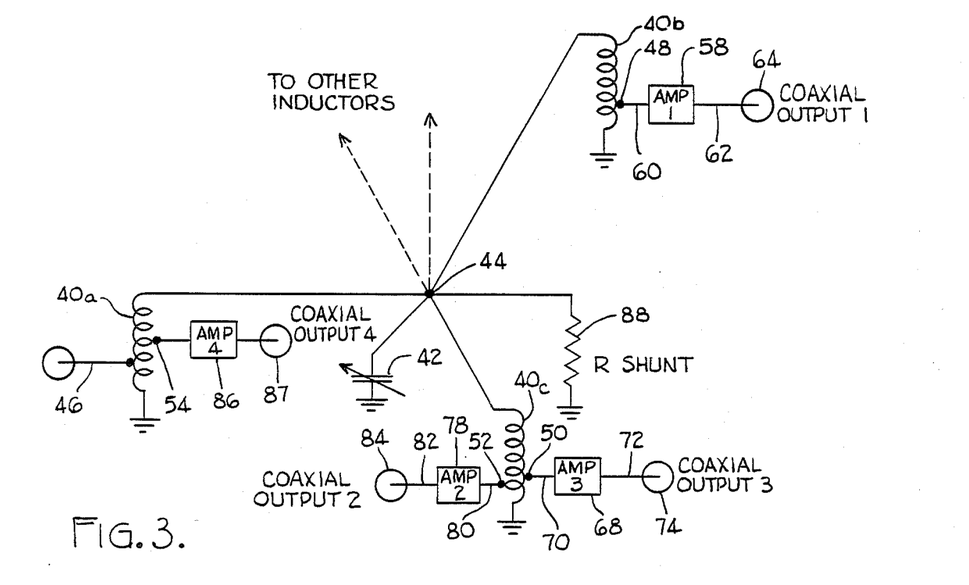
FIG. 3 is a schematic ciruict diagram of the receiver multicoupler of the present invention.

Referring now to FIG. 3 there is shown the basic receiver multicoupler circuit according to the present invention. The multicoupler comprises a no-loss signal splitter network comprising a high impedance parallel resonant circuit including a plurality of inductors, in the present illustration the three inductors designated 40a, 40b and 40c connected in parallel to a single variable capacitor 42 at a high impedance junction 44. The other ends of inductors 40a, 40b, 40c and capacitor 42 all are connected to a reference such as ground. In effect, the plurality of parallel capacitors 14a, 14b, 14c in the network of FIG. 1 are replaced by the single capacitor 42 in the network of FIG. 3. The single input to the multicoupler is in the form of a coaxial input 46 connected to a tap on inductor 40a of the no-loss signal splitter. The no-loss signal splitter includes a plurality of outputs, in the form of tap connections to the inductors 40a, 40b, 40c. In the illustrative network shown, inductor 40b is provided with the single tap connection 48 and inductor 40c has two tap connections 50 and 52. If desired, an additional output can be provided by a tap connection 54 on inductor 40a. Additional inductors may be connected in the circuit as indicated by the broken lines.

The receiver multicoupler of the present invention further comprises a plurality of very high resistance amplifiers, each amplifier connected to a corresponding one of the outputs of the no-loss signal splitter network. The amplifier input is connected to the splitter network output, and the amplifier output is connected to a coaxial terminal of the receiver multicoupler. In particular, the multicoupler of FIG. 3 includes a very high input resistance amplifier 58 having an input 60 connected to tap connection 48 of inductor 40b and an output 62 connected to a coaxial output 64 of the multi-coupler. The multicoupler further comprises another very high input resistance amplifier 68 having an input 70 connected to tap connection 50 of inductor 40c and an output 72 connected to a coaxial output 74 of the multicoupler. The multicoupler also comprises another very high input resistance amplifier 78 having an input 80 connected to tap connection 52 of inductor 40c and an output 82 connected to a coaxial output 84 of the multicoupler. Tap points 50 and 52 may or may not be at the same point. Another very high resistance amplifier 86 having input tap 54 is on inductor 40a to illustrate tap possibilities. Amplifiers 58, 68, 78 and 86 can be of the field effect transistor type. In the multicoupler of FIG. 3, there is isolation between all coaxial outputs 64, 74, 84 and 87. The high input resistance amplifiers 58, 68, 78, and 86 at each output point allow signal voltages to be sampled yet unaffected by the sampling process. The input capacitive reactance of the transistor in each amplifier 58, 68, 78 and 86 is compensated by the tuning capacitor 42. Reverse signal current flow through each amplifier transistor is minimal, allowing for proper values of output to output isolation.

The receiver multicoupler uses a no-loss passive signal distribution network to produce multiple outputs from one source. This is in contrast to the power divider which is the passive device heretofore used for this purpose. Because of the power divider's splitting loss, an amplifier always has to precede the power divider when signal to noise ratios (sensitivity) must not be degraded. The no loss distribution network in the receiver multicoupler of the present invention eliminates the need for the preamplifier. When no signal loss occurs, no signal to noise ratio degradation occurs and the network can be located directly at the input. This network produces multiple signal points at separate locations where high resistance amplifier circuits may be placed for impedance buffering and isolation purposes. One matching resistance 88, also designated R shunt, is supplied to properly terminate the input transmission line via transformer action, whether from the inherent LC circuit resistance or from an added resistance. The network allows compensation of the reactance presented by the transistor amplifier circuit. The two features, duplicated signals at separated locations and reactance compensation of the transistors attached at these points, allows this network to be functional at all frequencies where transistors are operable. The third feature, no signal loss, allows this network to be placed at the input location, eliminating the preamplifier of the prior art.

Thus, the operation of the receiver multicoupler of the present invention may be summarized as operating on the single input circuit to produce, passively, any number of parallel ports with no resulting signal loss, and then using an amplifier stage at each port to provide isolation and gain, if needed. Any attempt to maintain undiminished power, passively, across multiple outputs would fail, which is why a no-loss power divider does not exist. There is no problem with distributing an input signal equally to multiple ports passively if no power is dissipated at any of the multiple ports. The voltage present at these ports would be buffered from the low impedance (50 ohm) receiver circuits by modern, very high impedance amplifiers.

Consequently, the receiver multicoupler of the present invention comprises a no-loss splitter with no serious restrictions on the number of ports followed by very high input resistance amplifier in each path and is a new and improved means of producing isolated, identical multiple outputs from one input. While feasible to any low frequency, this approach is most suited to all applications using coaxial cable. This would include data and pulse circuits, along with radio frequency circuits.

A parallel resonant circuit has a high impedance at resonance at the junction of the inductance and capacitance, with reference to their opposite ends which are also common and are usually grounded. Any intermediate impedance level can be produced by probing between the two extremities as long as the circuit is unaffected (not loaded) by the probe. One 50 ohm input and any number of outputs could be accommodated on one resonant circuit, if physical spacing allowed. The method of this invention allows separate resonant elements to be used to supply the same impedance tap point at separated locations by having all resonant circuits tied together at their L-C junction, or high impedance point. The change in resonant impedance or circuit Q is small and separate yet identical signals are made available at multiple locations. One capacitor will suffice for all the resonant circuits while the inductors spread out to each amplifier location. The inductor and capacitor roles may be interchanged.

The signal splitter circuit of the present invention produces multiple, identical voltages at separated locations with no loss of signal which would affect the signal to noise ratio. There is no isolation between tap points, nor is significant amplifier loading permitted. A properly constructed amplifier circuit will easily have sufficiently high input resistance to eliminate loading and have sufficient reverse loss and low element to element coupling to provide isolation equal to or greater than power dividers normally provide. The combination of signal spliter circuit and buffer amplifiers according to the present invention provides a new and unique receiver multicoupler.

Figure 4:
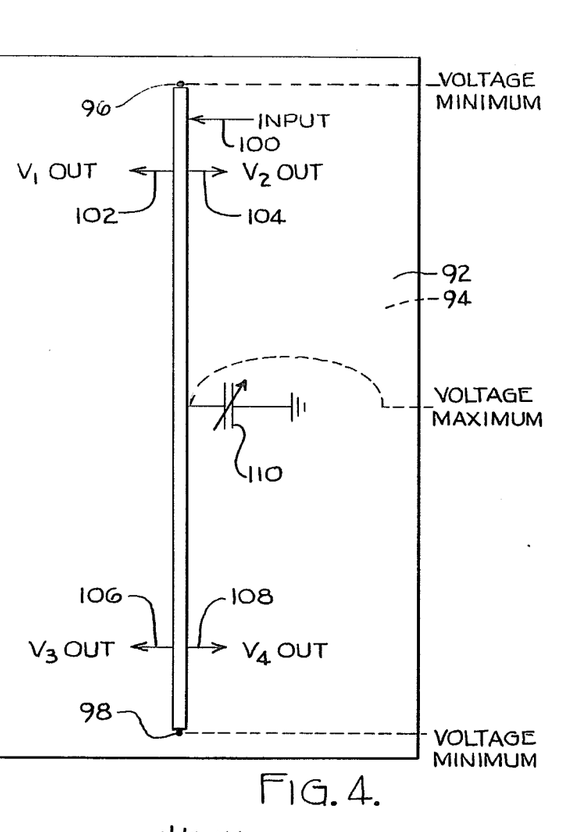
FIG. 4 is a plan view, partly diagrammatic, of a microstrip implementation of the circuit of FIG. 1.
Figure 5:
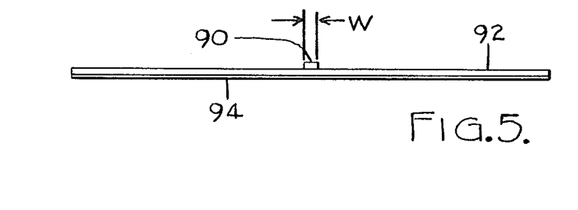
FIG. 5 is an end elevational view of the microstrip circuit of FIG. 4.

FIGS. 4 and 5 illustrate a microstrip implementation of the signal splitting circuit of FIG. 1. For many reasons, receiver multicouplers have their greatest usage at the shorter wavelengths where individual components (lumped, as contrasted to distributed components) may become impractical and where microstrip techniques using printed circuits provide a simple, economical construction. A slightly less than ¼ wavelength metal strip printed on a dielectric over a ground plane can be resonated at a desired frequency with a capacitor to form a resonant microstrip circuit. This is highly suitable in the Ultra High Frequency range of 300 to 3000 MHz. A nominal ½ wavelength line grounded at each end and with a capacitor at the middle produces two resonant circuits in parallel and others can be attached in parallel or spoke fashion. FIGS. 4 and 5 show a practical microstrip circuit schematic which is equivalent of the circuit of FIG. 1 where: the parallel capacitors are replaced by a single equivalent capacitor; high input resistance amplifiers are to be attached to each output tap point so that power absorption does not occur, yet reverse isolation and buffering from the low output impedance can occur; and the transistor's input reactance (generally capacitive) can be compensated by the tuning capacitor. Two oppositively facing transistors can be placed at one tap point, allowing the output circuits to be still physically separated as required for proper isolation.

In FIGS. 4 and 5, one capacitor resonates two individual inductors, which at Ultra High Frequencies may be simple metal strips on a printed circuit board. No space restrictions need be placed on the placement of these inductors, since they are inherently tightly coupled. However, the transistor output circuits must be properly spaced to maintain sufficient isolation, so as to force the coupling path between ports to pass through the transistors. This coupling consists of one transistor in the reverse direction (loss) and one transistor in the forward direction (gain). If proper care is taken to suppress the direct output to output flow path, normally desired isolation values of 20 dB are easily developed. For operation away from the resonant frequency of the network where the forward gain is reduced, the output isolation becomes greater as a result. This is the inverse of power divider circuits where output isolation decreases for out of band operation.

FET transistors of the dual gate type are most likely to have high input resistance, low input capacitance and high reverse isolation. No specific requirements exist for the inductor taps to be exactly equal in voltage level, nor for any or all tap points to be at the equivalent input tap point, but an inherent restriction for tap points approaching the tuning capacitor occurs as the amplifier's input capacitance becomes a significant fraction of the tuning capacitor. Generally, all operation requirements are satisfied for tap points located in the lower half of the inductor. A common-source FET circuit is suitable or any transistor configuration which provides isolation with output matching capability to 50 ohms is satisfactory.

The transistor circuitry buffers the distribution network from the low impedance output circuits and provides isolation. A low noise transistor will normally be chosen to allow the succeeding equipment's noise figure to be improved. Therefore, gain in these amplifiers is desirable for increased sensitivity but not to the same degree as in standard multicouplers where power losses exist.

When a prior art multicoupler is expanded at a later date by the user, a rearrangement of components is usually required to accommodate the extra power divider(s) and probably additional amplifier stage(s). Losses per channel would be uneven and excessive if new power dividers were simply attached to the existing units. The standard tree arrangement is therefore followed, using successive levels of power dividers with all outputs supplied by the last power divider level. This is complicated, costly and troublesome to implement.

Use of active signal splitters having nominal amounts of gain at each port according to the present invention allows expansion to be accomplished by the simpler, add-on method to an existing port. Expansion in the system of the present invention occurs after the original module, whereas expansion in the power divider system requires changes ahead of the original unit. These small self-contained signal splitter modules of the present invention with small overall gain can be cascaded serially to any desired port number, are easily added, use less space than present separated component multicouplers, produce cost benefits over separate components, and do not require high gain stages. When high gain is not required, other amplifier characteristics may be addressed.

As shown in FIGS. 4 and 5, a relatively narrow and thin metal strip 90 is printed on one surface of a dielectric base or plate 92, the opposite surface of which provided with a metal coating or layer 94 which serves as a ground plane. The microstrip circuit of FIG. 4 and 5 is for operation at about 500 MHz and provides a lossless signal distribution network comprising two inductors and four output points with input and outputs on the same inductor. Strip 90 has grounded opposite ends indicated at 96 and 98. There is a fifty ohm input 100 and four output points 102, 104, 106 and 108 designated V1out, V2 out, V3 out and V4 out. A variable capacitor 110 is connected between a point midway along strip 90 and electrical ground. Voltage minimums occur at the ground ends 96 and 98 of strip 90 and a voltage maximum is at the midpoint. One inductor is defined by the portion of the strip 90 including input 100 and outputs 102 and 104. The other inductor is defined by the portion of strip 90 including outputs 106 and 108. The width of strip 90, designated W in FIG. 5, is not critical for inductors and typically can be in the range from about 0.050 inch to 0.200 inch.

Figure 6:
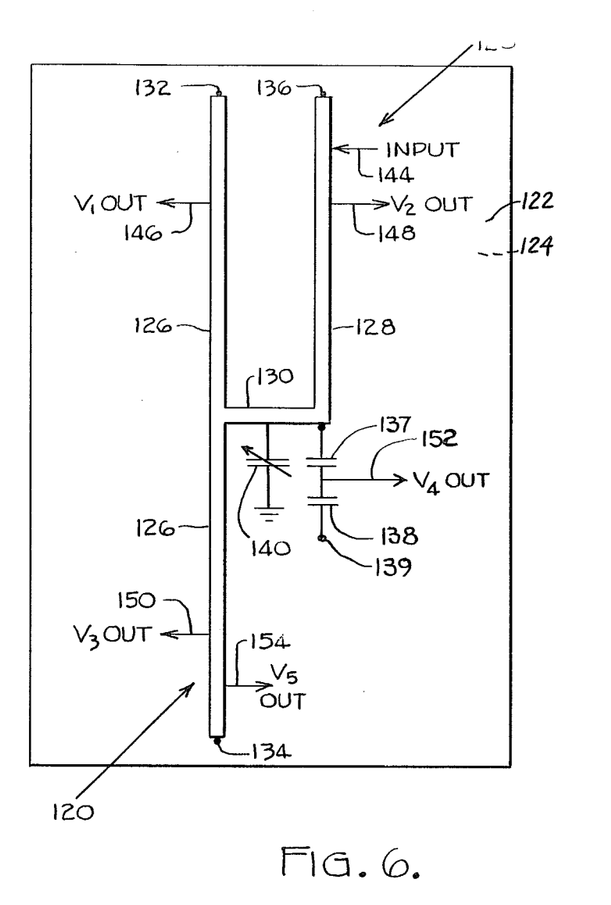
FIG. 6 is a plan view partly diagrammatic, of another form of signal splitter microstrip circuit according to the present invention.

FIG. 6 shows a microstrip implementation of a practical signal splitter circuit at 500 MHz including three inductors, a capacitor section, four equal output voltage taps and one low level output voltage tap for use in cascading units for larger numbers of outputs. In particular, four of the voltage tap points are shown at an arbitrary though equal voltage level. Noise figure, intermodulation distortion and other circuit considerations would affect the actual location of the input and output taps. Because the transistors used as voltage amplifiers will likely produce some gain, an output tap at a level equal to an input tap will develop a larger signal to an output port. One or more tap points may be desired at a lower-than-input level to produce minimal overall gain, as when a port for cascading purposes is supplied.

In the microstrip structure of FIG. 6, a relatively narrow and thin metal strip configuration generally designated 120 is printed on one surface of a dielectric base or plate 122, the opposite surface of which is provided with a metal coating or layer 124 which serves as a ground plane. Strip configuration 122 is generally in the form of an H having first and second sections 126 and 128, respectively which are relatively long and narrow and located on base 122 in spaced-apart, substantially parallel relation with the ends thereof in substantial alignment. Strip sections 126 and 128 are substantially equal in width and thickness and strip 128 is about one-half the length of strip 126. A shorter, intermediate strip section 130 is between section 126, 128 extending at substantially right angles to sections 126, 128 and joining the sections 126, 128 at about midway along the lengths thereof. Section 130 has substantially the same width and thickness as each of the sections 126, 128. Strip section 126 has grounded opposite ends 132 and 134, and strip section 128 has a grounded end 136. A capacitor section comprising the series combination of capacitors 137 and 138 is connected from the junction of sections 128 and 130 to a grounded end 139. The series capacitors 137, 138 are of proper ratio to provide the desired signal voltage value. A variable capacitor 140 is connected between a point mid-way along strip section 130 and electrical ground. There is a fifty ohm input designated 144, four equal voltage output points 146, 148, 150 and 152 also designated V1 out, V2 out, V3 out and V4 out, respectively, and one relatively lower voltage output point 154 also designated V5 out.

In the arrangement of FIG. 6, each section 126, 128 with half of section 130 is a nominal half-wave conducting strip which provides two nominal quarter-wavelength resonators in parallel, having the one parallel capacitor 140 for fine tuning to resonance. Three inductors are defined by the three strip sections including the three voltage output points 146, 148 and 150. Voltage output point 152 is on the capacitor section, in particular between capacitors 137 and 138. As an alternative, there can be additional capacitor sections connected in parallel with inductor sections. As a further alternative, each of the parallel sections can comprise a series combination of capacitors, and variable capacitor 140 can be replaced by an inductor.

Figure 7:
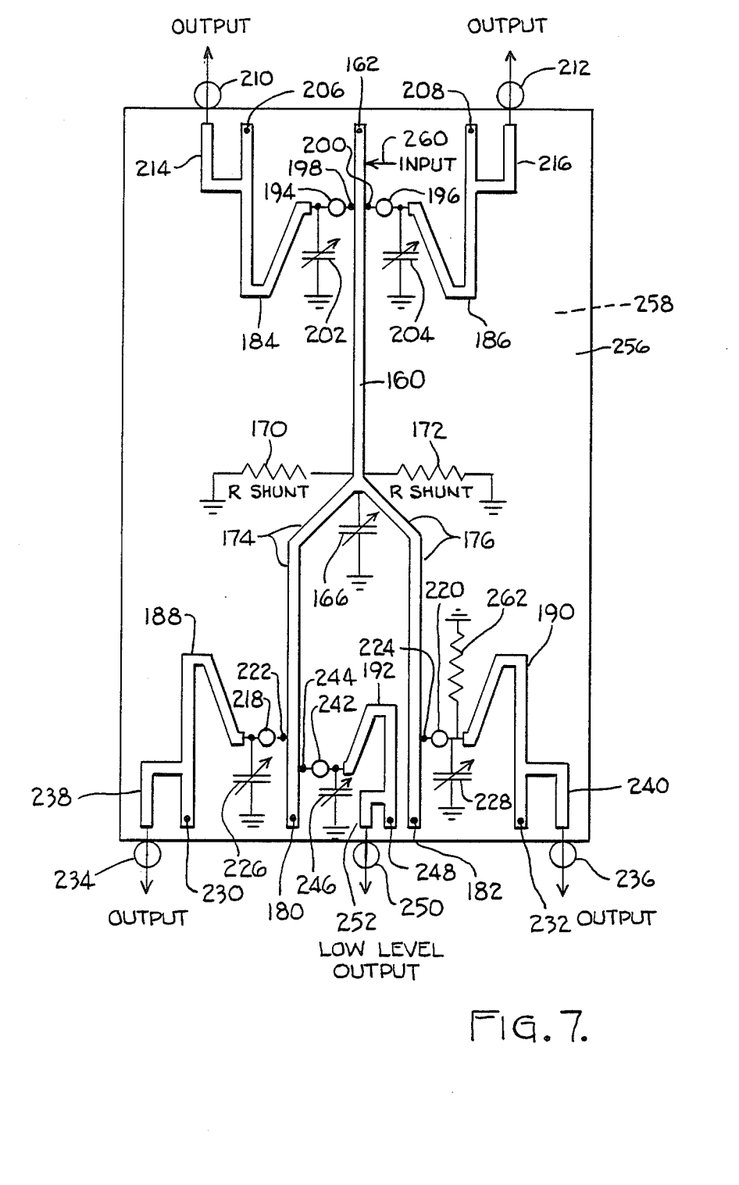
FIG. 7 is a plan view, partly diagrammatic, of a microstrip implementation of a receiver multicoupler according to another embodiment of the present invention.

FIG. 7 shows a microstrip implementation of a five port receiver multicoupler according to the present invention. The circuit of FIG. 7 is for operation at 500 MHz having one 50 ohm input, four equal 50 ohm outputs and one low level 50 ohm output with all output circuits including amplifiers and output LC circuits sufficiently isolated. The arrangement of FIG. 7 includes a main microstrip section in the form generally of a Y for input tap locations and a plurality of branch microstrip sections, one for each amplifier output, which branches are resonated with a variable capacitor to provide output circuits, each with a 50 ohm tap and terminal. In particular, the main microstrip section includes a straight strip 160 having a ground point 162 at one end and having the opposite end connected to one terminal of a variable capacitor 166, the other terminal of which is connected to electrical ground. The shunt resistance inherent in the circuit is represented by a resistor 170 connected between this end of strip 160 and electrical ground. Additional resistance if desired can be provided by connecting a resistor 172 between this end of strip 160 and electrical ground. The main microstrip section further includes a pair of strips 174 and 176 each connected at one end thereof to the end of strip 160 containing variable capacitor 166 which strips 174 and 176 extend at angles to strip 160. In the arrangement shown, each strip 174, 176 has a first portion extending at an acute angle to strip 160 and a second portion extending parallel to strip 160 thereby defining a Y or fork-like formation. The outer ends of sections 174 and 176 are grounded as indicated at 180 and 182.

In the arrangement shown, there are five branch microstrip sections, one for each output, with four being equal voltage level outputs and the fifth being a relatively lower level voltage output. In particular, the branches designated 184, 186, 188 and 190 are at equal voltage level outputs and the branch 192 is at a lower level voltage. Branches 184 and 186 are connected each at one end to the outputs of transistors 194 and 196 the inputs of which are connected through tap points 198 and 200, respectively, to strip 160. Transistors 194 and 196 are implemented in microstrip, printed circuit form according to known techniques. Connections 198, 200 are shown in FIG. 7 at the same distance from ground point 162 which is about one-quarter of the length of strip 160 but may be at unequal distances. Variable capacitors 202 and 204 are connected between transistors 194 and 196, respectively, and electrical ground. The other ends of branches 184 and 186 are grounded as indicated at 206,208. Branches 184 and 186 and capacitors 202 and 204 are the LC circuits for the output stages of the transistor amplifiers. Two outputs 210 and 212 of the microstrip circuit are connected by 50 ohm coupling strip sections 214 and 216, respectively, to the two branches 184 and 186, respectively. The coupling strip sections 214 and 216 are connected to the 50 ohm points on branches 184 and 186 measured from the ground connections and these line widths should be designed for 50 ohms line impedance.

In a similar manner, branches 188 and 190 are connected each at one end to the outputs of transistors 218 and 220, the inputs of which are connected through tap points 222 and 224, respectively, to strips 174 and 176 at equal distances from ground connections 180 and 182, respectively which is about one-quarter of the length of the corresponding strip 174, 176. Alternatively, tap points 222 and 224 may be at unequal distances. Variable capacitors 226 and 228 are connected between transistors 218 and 220, respectively, and electrical ground to form LC output circuits. The other ends of branches 188 and 190 are grounded as indicated at 230,232. Two additional outputs 234 and 236 of the microstrip circuit are connected by coupling strip sections 238 and 240, respectively, to the two branches 188 and 190, respectively. The coupling strip sections 238 and 240 are connected to the 50 ohm points on branches 188 and 190 measured from the ground connections and these line widths should be designed for 50 ohms line impedance.

As previously indicated, the four outputs 210, 212, 234 and 236 are equal voltage level outputs. The circuit of FIG. 7 further includes a fifth branch 192 providing a relatively lower level voltage output. Branch 192 is connected at one end to the output of a transistor 242 the input of which is connected through a tap point 244 to strip 172 and at a location closer to ground connection 180 than tap 222. A variable capacitor 246 is connected between transistor 242 and electrical ground to form an LC output circuit. The other end of branch 192 is grounded as indicated at 248. An output 250 is connected by a 50 ohm coupling strip 252 of proper width to branch 192, the strip 252 being connected to the 50 ohm point on branch 192 measured from the ground connection.

As in the previous embodiments, the main, branch and coupling microstrip sections are printed on one surface of a dielectric base or plate 256, the opposite surface of which is provided with a metal layer or coating 258 which serves as a ground plane. Each of the branch microstrip sections 184, 186, 188, 190 and 192 comprises two arms defining therebetween an acute angle and a relatively shorter intermediate arm joining two ends of the larger arm. The branches 184, 186, 188, 190 and 192 are oriented such that the arm leading from the tap point connection is disposed at an acute angle with respect to the corresponding strip of the main microstrip section, the intermediate arm is disposed substantially perpendicular to that corresponding strip, and the other arm coupled to the output is disposed substantially parallel to that corresponding strip. A fifty ohm input for the circuit is designated 260. Not shown is the input terminal and 50 ohm input printed line to tap point 260. If individual shunt resistance is desired for selective broadening of a special output, it may be connected to a transistor output lead, for example resistor 262 connected between the output of transistor 220 and electrical ground.

The multicoupler of FIG. 7 would be utilized by providing coaxial cables to receivers at each of the outputs, i.e. the receiver input cables being connected to the outputs 210, 212, 234, 236 and 250. All of the output circuits are sufficiently isolated. Output 250 could become the input to another circuit module for expansion serially to 9 ports. In the multicoupler of FIG. 7, transistors 194, 196, 218, 220 and 242 can be field effect transistors, all implemented by known microstrip printed circuit techniques.

As an alternative to the signal splitter network illustrated in FIG. 3, the parallel resonant circuit can include a plurality of capacitor sections in parallel with one inductor, each parallel capacitor section, in turn, comprising two or more series capacitors to provide the proper signal voltage value. As a further alternative, the parallel resonant circuit can include a plurality of parallel inductors and parallel capacitor sections, each parallel capacitor section comprising two or more series capacitors of the proper ratio to provide the desired signal voltage value.

The multicoupler of the present invention has a number of important advantages and characterizing features. The signal splitting network, having no signal loss to degrade the system signal to noise ratio, does not require the use of preamplifier stage. The signal splitting network compensates for input reactance effects of attachments, normally transistors, thereby raising the upper frequency limitation to the operational limitations of the attachments. The signal splitting network provides physically separated yet identical signal locations into the GHz range of frequencies, thereby allowing the port to port isolation path to be restricted to the transistors which path can be regulated to produce and maintain the desired isolation.

The multicoupler is practical and useful at all frequencies where transistors are operational, being useful at the lowest radio frequencies using lumped components to the highest operational ranges of transistors using presently known techniques. The multicoupler scheme allows the use of minimum gain amplifiers for general economy, reduced interference problems, and consequent greater consideration possible to other system characteristics. The multicoupler uses individual channel transistors to increase system reliability, as contrasted to a single, common preamplifier where the multicoupler is prone to catastrophic failure. Expansion to a larger number of ports is easily accomplished by simple add-on to an existing port. An approximately unity gain output port is easily producible, though not essential, to be made available for this specific purpose, in which case repeated cascading would not produce excessively high signal values. The reversal of amplifier and divider functions allows placement of amplifiers at the signal splitter network, eliminating space and costs associated with separate containers and interconnection cabling and resulting in a smaller, more economical package. Except for those remote, low signal density locations where the extremely wide bandwidth operation of the standard multicopuler is useful without a preceding narrow band filter, this relatively narrow band signal splitter multicoupler can be adjusted in bandwidth via the shunt resistor to eliminate or reduce the need for a preselector.

It is therefore apparent that the present invention accomplishes its intended objects. While embodiments of the present invention have been described in detail, that is done for the purpose of illustration, not limitation.

I claim:

1. A receiver multicoupler having multiple, isolated outputs generated from a single input comprising:
   (a) a signal splitting network directly connected to said input and comprising a plurality of parallel branch circuits collectively defining a single resonant circuit having a single resonant frequency and connected together at the high impedance junctions thereof, each of said parallel branch circuits having an output, said network providing substantially equal and separated voltages simultaneously at said parallel branch circuit outputs, said network providing substantially no degradation in signal to noise ratio and providing voltage transfer under mismatched conditions; and
   (b) a plurality of very high input resistance voltage amplifiers, one for each of said parallel branch circuits of said signal splitting network, each of said amplifiers having an input connected to a corresponding one of said outputs of said parallel branch circuits, each of said amplifiers acting as an impedance buffer and supplying isolation.

2. A receiver multicoupler according to claim 1, wherein each of said parallel branch circuits comprises the parallel combination of an inductor and a variable capacitor.

3. A receiver multicoupler according to claim 1, wherein said plurality of parallel branch circuits comprises a plurality of inductors connected in parallel to a single variable capacitor at a high impedance junction.

4. A receiver multicoupler according to claim 1, further including shunt resistance means connected between said high impedance junctions and ground for the purpose of loading to increase bandwidth.

5. A receiver multicoupler according to claim 1, wherein each of said amplifiers is of the field effect transistor type.

6. A receiver multicoupler according to claim 1, wherein said plurality of parallel branch circuits comprises a plurality of capacitor sections connected in parallel to a single inductor at a high impedance junction, each parallel capacitor section comprising at least two series capacitors to provide a selected signal voltage value.

7. A receiver multicoupler according to claim 1, wherein said plurality of parallel branch circuits comprises a plurality of inductors connected in parallel to a plurality of capacitor sections at a high impedance junction, each parallel capacitor section comprising at least two series capacitors to provide a selected signal voltage value.

8. A receiver multicoupler according to claim 1, wherein said signal splitting network is implemented in the form of a microstrip circuit.

9. A receiver multicoupler according to claim 1, further including individual shunt resistances in selected output parallel branch circuits to allow greater bandwidth in respective outputs.

10. A receiver multicoupler having multiple, isolated outputs generated from a single input comprising:
    (a) a resonant voltage distribution system directly connected to said input for developing separated points of substantially equal voltage at or near the input impedance level and providing substantially no degradation in signal to noise ratio so as to avoid need for make-up gain preceding said system, said distribution system providing voltage transfer under mismatched conditions, said voltage distribution system comprising a narrow band signal splitting network including shunt resistance means connected between said voltage distribution system and ground for adjusting the multicoupler bandwidth; and
    (b) a plurality of minimum gain voltage aplifiers, one for each of said multicoupler outputs, each of said amplifiers having an input connected to said voltage distribution system, and each of said amplifiers acting as an impedance buffer and supplying isolation and minimizing interference.

11. A receiver multicoupler having multiple, isolated outputs generated from a single input comprising:
    (a) a passive voltage distribution system directly connected to said input, said distribution system comprising a signal splitting network including parallel tuned circuits providing multiple voltage outputs from a single input, said distribution system providing substantially no degradation in signal to noise ratio and providing voltage transfer under mismatched conditions;
    (b) a plurality of voltage amplifiers, one for each of said outputs, each of said amplifiers having an input connected to said passive voltage distribution system, and each of said amplifiers acting as an impedance buffer and supplying isolation and gain; and
    (c) shunt resistance means connected between said voltage distribution system and ground for producing wide-band operation.

* * * * *